United States Patent
Matsui

(10) Patent No.: US 6,918,075 B2
(45) Date of Patent: Jul. 12, 2005

(54) PATTERN GENERATOR FOR SEMICONDUCTOR TEST SYSTEM

(75) Inventor: Tsuruto Matsui, Gunma (JP)

(73) Assignee: Advantest Corp., Tokyo (JP)

( * ) Notice: Subject to any disclaimer, the term of this patent is extended or adjusted under 35 U.S.C. 154(b) by 481 days.

(21) Appl. No.: 09/853,998

(22) Filed: May 12, 2001

(65) Prior Publication Data

US 2002/0013920 A1 Jan. 31, 2002

(30) Foreign Application Priority Data

May 19, 2000 (JP) .................................... 2000-152776

(51) Int. Cl.[7] .................... G06F 11/263; G06F 12/00; G11C 29/00
(52) U.S. Cl. ................... 714/738; 714/720; 365/201; 711/217
(58) Field of Search ................... 714/702, 718–720, 714/738, 723, 736, 824, FOR 290; 365/201, 230; 711/202, 217

(56) References Cited

U.S. PATENT DOCUMENTS

| | | | |
|---|---|---|---|
| 5,724,367 A | * | 3/1998 | Osawa et al. ............ 714/720 |
| 5,852,618 A | | 12/1998 | Fujisaki |
| 5,925,141 A | * | 7/1999 | Ariki ..................... 714/718 |
| 6,011,748 A | * | 1/2000 | Lepejian et al. ........... 365/233 |
| 6,032,275 A | | 2/2000 | Tsuto |
| 6,094,738 A | | 7/2000 | Yamada et al. |
| 6,513,138 B1 | * | 1/2003 | Ohsawa ................... 714/738 |
| 6,523,135 B1 | * | 2/2003 | Nakamura ................ 714/30 |

* cited by examiner

Primary Examiner—Guy J. Lamarre
Assistant Examiner—Cynthia Britt
(74) Attorney, Agent, or Firm—Muramatsu & Associates

(57) ABSTRACT

A pattern generator for semiconductor test system for testing a semiconductor memory device by generating and applying test patterns. The pattern generator is capable of freely generating inversion request signals for inverting the read/write data for specified memory cells for a memory device under test having different total numbers of memory cells between X (row) and Y (column) directions. The locations of specified memory cells are on a diagonal line on an array of memory cells in the memory device under test or on a reverse diagonal line which is perpendicular to the diagonal line.

8 Claims, 7 Drawing Sheets

FIG. 3A

X direction → X address

|   | #0 | #1 | #2 | #3 |
|---|----|----|----|----|
| #0 | #0 | #1 | #2 | #3 |
| #1 | #3 | #0 | #1 | #2 |
| #2 | #2 | #3 | #0 | #1 |
| #3 | #1 | #2 | #3 | #0 |

Y direction, Y address, memory device

FIG. 3B

X direction → X address

|   | #0 | #1 | #2 | #3 |
|---|----|----|----|----|
| #0 | #3 | #2 | #1 | #0 |
| #1 | #2 | #1 | #0 | #3 |
| #2 | #1 | #0 | #3 | #2 |
| #3 | #0 | #3 | #2 | #1 |

Y direction, Y address, memory device max. X address value = #7
max. Y address value = #3
diagonal inversion set value = #3

| X address of memory cell | #0 | #1 | #2 | #3 | #4 | #5 | #6 | #7 |
|---|---|---|---|---|---|---|---|---|
| X address of memory cell & maximum X address value | #0 | #1 | #2 | #3 | #4 | #5 | #6 | #7 |

| Y address of memory cell | Y address of memory cell + diagonal inversion set value & maximum Y address value |
|---|---|
| #0 | #3 |
| #1 | #0 |
| #2 | #1 |
| #3 | #2 | max. X address value = #7
max. Y address value = #3
diagonal inversion set value = #3

| X address of memory cell | #0 | #1 | #2 | #3 | #4 | #5 | #6 | #7 |
|---|---|---|---|---|---|---|---|---|
| X address of memory cell & maximum X address value | #0 | #1 | #2 | #3 | #0 | #1 | #2 | #3 | inverted cell

X  inversion expected cell

| Y address of memory cell | Y address of memory cell + diagonal inversion set value & maximum Y address value |
|---|---|
| #0 | #3 |
| #1 | #0 |
| #2 | #1 |
| #3 | #2 |

PATTERN GENERATOR FOR SEMICONDUCTOR TEST SYSTEM

FIELD OF THE INVENTION

This invention relates to a pattern generator for a semiconductor test apparatus for testing a semiconductor memory device by generating and applying test patterns to a device under test, and more particularly, to a pattern generator and pattern generation method for a semiconductor test apparatus for freely generating inverse request signals for inverting the read/write data for specified memory cells in a memory device having different numbers of memory cells between X and Y directions.

BACKGROUND OF THE INVENTION

In testing semiconductor devices such as ICs and LSIs by a semiconductor test system, a semiconductor IC device to be tested is provided with test signals (test patterns) produced by a pattern generator in the semiconductor test system at its appropriate test pins at predetermined test timings. The semiconductor test system receives output signals from the IC device under test in response to the test signals. The output signals are strobed (sampled) by strobe signals at predetermined timings to be compared with expected output data to determine whether the IC device functions correctly or not.

In the case where the device under test (DUT) is a semiconductor memory, the test pattern applied to the DUT consists of address data, write data, and control data. After writing predetermined data in predetermined addresses (memory cells) of the DUT, the data in the addresses is read to determine whether the stored data in the memory is the same as the write data. For testing a semiconductor memory, a test pattern generated by the pattern generator includes various data and control signals including the address data, write data and control data noted above as well as expected data, address and control data for storing test results in a failure memory, and etc.

An example of basic structure in a typical semiconductor test system having a pattern generator is shown in FIG. 1. Within the context of the invention, the pattern generator can be applied to a semiconductor test system which is exclusively configured for testing semiconductor memories as well as to a semiconductor test system configured for testing an LSI such as a system-on-a-chip IC having a memory block or memory core therein as apart of the LSI.

In FIG. 1, the semiconductor test system includes a timing generator TG for generating timing clocks, a pattern generator PG for generating test pattern including various address data and control signals, a format controller (wave formatter) FC for wave formatting the test pattern, a pin electronics for interfacing with a device under test (DUT), a digital (logic) comparator DC for comparing an output of DUT with expected data, and a failure memory FM including an address fail memory AFM for storing test results for failure analysis.

Based on timing clocks from the timing generator TG, the pattern generator PG generates test patterns such as address data and control signals which are supplied to the format controller FC. The format controller FC provides the test pattern to the DUT with specified waveforms and timings through the pin electronics. The pattern generator PG also generates expected data EXP which is supplied to the digital comparator DC to compare with the data from the DUT at the timings of strobe signals from the timing generator TG.

Upon detecting a mismatch between the DUT output data and the expected data EXP, an error indication is produced by the comparator DC. Such error (failure) data is stored in the failure memory FM (or address fail memory AFM therein) in the addresses specified by the address data from the pattern generator PG corresponding to the addresses of the DUT. The error data in the failure memory FM could represent the actual value of the device output pin at the strobe point, or it could be just a single bit indicating pass or fail. The test engineers and design engineers use the error data in the failure memory FM to analyze correctness of the device design and functions.

As is well known in the art, a memory is configured by a large number of memory cells each being specified by a combination of a row (X) address and a column (Y) address. In memory testing, one of the important test items is to examine whether there is an interference between memory cells, which is sometimes called "pattern sensitive faults" or "neighborhood pattern sensitive faults". Typically, such a fault is examined by writing data (such as "1") in a particular memory cell which is opposite to data (such as "0") in adjacent memory cells. The semiconductor test system monitors whether the particular cell correctly stores the write data "1" when all the neighborhood cells store the write data "0"

In other words, a pattern generator in the semiconductor test system is designed to include a functionality dedicated to memory testing which is able to invert write data for a specified memory cell (address) of the memory device under test. Because of such a data inversion function provided in the pattern generator, a complicated test pattern can be generated at high speed without requiring a complicated test program.

A pattern generator PG used for such memory testing is usually an ALPG (Algorithmic Pattern Generator) having an arithmetic function therein for generating test patterns including address data, write data, and control data to be applied to the DUT. More specifically, the pattern generator generates test patterns to be applied to the DUT pins such as an address pin, data pin, and control pin. An example of the control data includes chip enable (CE). write enable (WE), output enable (OE), row address strobe (RAS) and column address strobe (CAS). The pattern generator PG also generates expected pattern EXP to be provided to the digital comparator DC for comparison with the data read from the DUT, and address data and control data for controlling the address fail memory AFM for storing the test results therein. The pattern generator PG further generates control signals such as an inversion request signal, which is the subject of the present invention as will be described in detail later.

FIG. 2A shows a block diagram showing an essential structure of the pattern generator PG. In this example, the pattern generator is comprised of a sequence controller 400, an address generator 200, a data generator 300, and a control signal generator 100. As shown in FIG. 1, the pattern generator receives the timing (reference) clocks from the timing generator TG, thereby generating the test pattern (address data, write data, and control data, etc.) in synchronism with the reference clock.

The address generator 200 generates address data 200s, the data generator 300 generates data 300s, and control signal generator 100 generates control signals 100s. The data 300s includes an inversion request signal 110s which is now explained in detail. The inversion request signal 110s (FIG. 2B) is to produce a test pattern which can detect the "pattern sensitive faults" or "neighborhood pattern sensitive faults" of the memory device under test as mentioned above.

The inversion request signal 100s is to produce write data such as "1" for a specified memory cell when the write data for all other neighboring memory cells is "0", or vice versa. Typically, a location of such a specified memory cell is shifted in a diagonal direction such as shown by hatched portions of FIG. 4 to effectively detect "pattern sensitive faults". For performing such a test, the pattern generator PG generates the address data which increments by one to sequentially access the memory cells, and write data such as "0" for all of the memory cells, and an inversion request signal for a specified memory cell to invert the write data to "1".

FIG. 2B is a block diagram showing essential components in the pattern generator related to generating the inversion request signal 110s. It should be noted that this example is an internal knowledge of the inventor and assignee of this invention, but not publicly available information. Therefore, the example of FIG. 2B is not prior art against the present invention. In the example of FIG. 2B, the number of X address lines and Y address lines is 16, respectively. The inversion request signal circuit of FIG. 2B includes a diagonal inversion set register 10, an accumulator 20, an X AND gate 32, a Y AND gate 34, and a comparator (exclusive OR) 40.

The diagonal inversion set register 10 is a register with a 16-bit width for storing a set value specifying which diagonal line to be selected as locations of specific memory cells for data inversion. The accumulator 20 is a 16-bit arithmetic adder which receives the Y address data with a 16-bit width from address generator 200 as well as the set value from the diagonal inversion set register 10, and outputs the added result of 16-bit data YA. During this process, a carry over signal resulted from the addition is not used.

The X AND gate 32 is provided with the maximum X address value at one input while X address data is provided at another input. The Y AND gate 34 is provided with the maximum Y address value at one input while the added result YA from the accumulator 20 is provided at another input. The maximum X address value and maximum Y address value are provided as mask data for limiting an effective bit width in the 16-bit width of the address data based on the size of the DUT. For example, in the memory configuration shown in FIG. 3, because the effective bit width is 2-bit, the mask data (maximum address value) expressed in a binary form is "0000,0000,0000,0011", thereby masking data bits higher than the first two bits.

The Y AND gate 34 produces a 16-bit output data YB resulted from logic AND for each bit between the maximum Y address value and the accumulated output 16-bit data YA. The output data YB (Y comparison data) is provided to the comparator 40. The X AND gate 32 produces a 16-bit output data XA resulted from logic AND for each bit between the maximum X address value and the 16-bit width X address data. The output data XA (X comparison data) is provided to the comparator 40.

The comparator 40 receives the 16-bit width Y comparison data YB and the 16-bit width X comparison data XA, compares each and every corresponding bit therebetween, and generates an inversion request signal only when all of the bits matched with one another. As a result of this process, the write data for specified memory cells in the DUT is automatically inverted and written therein. In addition, the expected data provided to the digital comparator DC is also inverted accordingly so that the logic comparison with the read out data of the DUT can be conducted correctly. The information on the data inversion is provided to the address fail memory AFM as well to be used for failure analysis.

Therefore, by defining a set value in the diagonal inversion set register 10 and other data such as maximum address data, the inversion request signal 110s noted above can be generated. Thus, data inversion is performed for memory cells on an arbitrary diagonal line on an array of memory cells without requiring to produce a complicated pattern program.

The logic operation performed in the block diagram of FIG. 2B for generating the inversion request signal 110s is summarized in the conditional equation 1 below.

(Y address of memory cell+diagonal inversion set value) AND maximum Y address value=X address of memory cell AND maximum X address value        Conditional equation 1:

FIG. 3A shows an example of relationship between the neighborhood memory cells and the specified memory cells in a diagonally line for writing inverted data therein. In this example, the set value in the diagonal inversion set register 10 is "#3" and the memory cells on the specified diagonal line are denoted by "#3".

Further, conditional equation 2 below is to reverse the data on the backward diagonal line perpendicular to the diagonal line defined by the conditional equation 1.

*(Y address of memory cell+diagonal inversion set value) AND maximum Y address value=maximum X address value AND Y address of memory cell        Conditional equation 2:

Here, a mark * at the front of the equation 2 signifies bit inversion which inverts the data indicating the added result within the parentheses that comes immediately after the mark. The relationship between the neighborhood memory cells and specified memory cells in the reverse diagonally line for writing inverted data therein is shown in FIG. 3B. In this example, the set value in the diagonal inversion set register 10 is "#3" and the memory cells on the specified diagonal line are denoted by "#3". The diagonal line of FIG. 3B is perpendicular to the diagonal line of FIG. 3A.

A specific example of diagonal inversion operation is described hereafter based on the circuit diagram of FIG. 2B for generating the inversion request signal 110s. For the simplicity of explanation, the following description is made for the case where the memory device under test has an array of 4×4 memory cell as shown in FIG. 4. In this procedure, the write data for specified memory cells on a diagonal line on the memory cell array is inverted. Since the memory cells are arranged in a "4×4" array, the maximum value of X address and Y address is "#3", respectively. It is assumed that both of the X address and Y address start from "#0", and the set value for the diagonal inversion set register 10 is "#3". Thus, only the lower two bits are considered in the following process by masking third or higher bits.

Based on the conditions mentioned above, the process of determining whether the write data for a memory cell defined by the address data should be inverted is described in the following for each and every X, Y address. This process is conducted by computing the right and left sides of the conditional equation 1 above, and when the computed results match with each other, it is determined that the write data for the address is inverted.

First, when the address of a memory cell is (X, Y)=(0, 0), the conditional equation of left side "(Y address of memory cell+diagonal inversion set value) AND maximum Y address value" is (0+3) AND 3=3, and the conditional equation of right side "(X address of memory cell AND maximum X address value)" is 0 AND 3=0, thus, left side≠right side. Therefore, the data is not inverted for the memory cell. Note that "0+3" above is "00+11" which is "11" in binary form, thus "(0+3) AND 3" above is "11 AND 11" which is "11" in binary form, i.e., "3". Also note that "0 AND 3" above is "00 AND 11" which is "00" in binary form, i.e., "0". Similar rule applies to the following descriptions.

Second, when the address of the next memory cell is (x, Y)=(1, 0), the conditional equation of left side "(Y address of memory cell+diagonal inversion set value) AND maximum Y address value" is (0+3) AND 3=3, and the conditional equation of right side "(X address of memory cell AND maximum X address value)" is 1 AND 3=1, thus, left side≠right side. Therefore, the data is not inverted for this memory cell.

Third, when the address of a memory cell is (X, Y)=(2, 0), the conditional equation of left side "(Y address of memory cell+diagonal inversion set value) AND maximum Y address value" is (0+3) AND 3=3, and the conditional equation of right side "(X address of memory cell AND maximum X address value)" is 2 AND 3=2, thus, left side≠right side. Therefore, the data is not inverted for the memory cell.

Fourth, when the address of a memory cell is (X, Y)=(3, 0), the conditional equation of left side "(Y address of memory cell+diagonal inversion set value) AND maximum Y address value" is (0+3) AND 3=3, and the conditional equation of right side "(X address of memory cell AND maximum X address value)" is 3 AND 3=3, thus, left side=right side. Therefore, the data is inverted for this memory cell.

Fifth, when the address of a memory cell is (X, Y)=(0, 1), the conditional equation of left side "(Y address of memory cell+diagonal inversion set value) AND maximum Y address value" is (1+3) AND 3=0, and the conditional equation of right side "(X address of memory cell AND maximum X address value)" is 0 AND 3=0, thus, left side=right side. Therefore, the data is inverted for this memory cell. Note that "1+3" above is "01+11" which is "100" in binary form, and only lower two bits are valid by masking the higher bits, thus "(1+3) AND 3" above is "00 AND 11" which is "00" in binary form, i.e., "0". Similar rule applies to the following descriptions.

Sixth, when the address of a memory cell is (X, Y)=(1, 1), the conditional equation of left side "(Y address of memory cell+diagonal inversion set value) AND maximum Y address value" is (1+3) AND 3=0, and the conditional equation of right side "(X address of memory cell AND maximum X address value)" is 1 AND 3=1, thus, left side≠right side. Therefore, the data is not inverted for the memory cell.

Seventh, when the address of a memory cell is (X, Y)=(2, 1), the conditional equation of left side "(Y address of memory cell+diagonal inversion set value) AND maximum Y address value" is (1+3) AND 3=0, and the conditional equation of right side "(X address of memory cell AND maximum X address value)" is 2 AND 3=2, thus, left side≠right side. Therefore, the data is not inverted for this memory cell.

Eighth, when the address of a memory cell is (X, Y)=(3, 1), the conditional equation of left side "(Y address of memory cell+diagonal inversion set value) AND maximum Y address value" is (1+3) AND 3=0, and the conditional equation of right side "(X address of memory cell AND maximum X address value)" is 3 AND 3=3, thus, left side≠right side. Therefore, the data is not inverted for the memory cell.

Ninth, when the address of a memory cell is (X, Y)=(0, 2), the conditional equation of left side "(Y address of memory cell+diagonal inversion set value) AND maximum Y address value" is (2+3) AND 3=1, and the conditional equation of right side "(X address of memory cell AND maximum X address value)" is 0 AND 3=0, thus, left side≠right side. Therefore, the data is not inverted for this memory cell.

Tenth, when the address of a memory cell is (X, Y)=(1, 2), the conditional equation of left side "(Y address of memory cell+diagonal inversion set value) AND maximum Y address value" is (2+3) AND 3=1, and the conditional equation of right side "(X address of memory cell AND maximum X address value)" is 1 AND 3=1, thus, left side=right side. Therefore, the data is inverted for this memory cell.

Eleventh, when the address of a memory cell is (X, Y)=(2, 2), the conditional equation of left side "(Y address of memory cell+diagonal inversion set value) AND maximum Y address value" is (2+3) AND 3=1, and the conditional equation of right side "(X address of memory cell AND maximum X address value)" is 2 AND 3=2, thus, left side≠right side. Therefore the data is not inverted for the memory cell.

Twelfth, when the address of a memory cell is (X, Y)=(3, 2), the conditional equation of left side "(Y address of memory cell+diagonal inversion set value) AND maximum Y address value" is (2+3) AND 3=1, and the conditional equation of right side "(X address of memory cell AND maximum X address value)" is 3 AND 3=3, thus, left side≠right side. Therefore, the data is not inverted for the memory cell.

Thirteenth, when the address of a memory cell is (X, Y)=(0, 3), the conditional equation of left side "(Y address of memory cell+diagonal inversion set value) AND maximum Y address value" is (3+3) AND 3=2, and the conditional equation of "(X address of memory cell AND maximum X address value)" is 0 AND 3=0, thus, left side≠right side. Therefore, the data is not inverted for the memory cell.

Fourteenth, when the address of a memory cell is (X, Y)=(1, 3), the conditional equation of left side "(Y address of memory cell+diagonal inversion set value) AND maximum Y address value" is (3+3) AND 3=2, and the conditional equation of "(X address of memory cell AND maximum X address value)" is 1 AND 3=1, thus, left side≠right side. Therefore, the data is not inverted for the memory cell.

Fifteenth, when the address of a memory cell is (X, Y)=(2, 3), the conditional equation of left side "(Y address of memory cell+diagonal inversion set value) AND maximum Y address value" is (3+3) AND 3=2, and the conditional equation of right side "(X address of memory cell AND maximum X address value)" is 2 AND 3=2, thus, left side=right side. Therefore, the data is inverted for this memory cell.

Sixteenth, when the address of a memory cell is (X, Y)=(3, 3), the conditional equation of left side "(Y address of memory cell+diagonal inversion set value) AND maximum Y address value" is (3+3) AND 3=2, and the conditional equation of right side "(X address of memory cell AND maximum X address value) is 3 AND 3=3, thus, left side≠right side. Therefore, the data is not inverted for the memory cell.

From the computation results in the foregoing, the left and right side of the computation results match with each other in the fourth, fifth, tenth, and fifteenth computations, resulting in an inversion request signal 110s at the output of the pattern generator PG. As a result of the inversion request signal 110s, the write data for the specific memory cells is inverted as shown by the hatch in FIG. 4. Note that the locations of the specific memory cells are on a diagonal line on the array (diagonal inversion), which is considered effective in evaluating the pattern sensitive faults of a memory device.

As described in the foregoing, the circuit diagram of FIG. 2B is effective in producing a test pattern including a pattern inversion operation. However, in the case where the numbers of memory cells differ in the X and Y directions, there arises a problem that the circuit diagram of FIG. 2B does not always function properly. In other words, certain memory cells are not provided with write data inverted from the neighborhood memory cells in such type of memory device. This discrepancy is described below with reference to FIGS. 5 and 6.

In the example of FIGS. 5 and 6, it is assumed that a diagonal inversion operation will be performed for the uneven numbers of memory cells in X and Y directions, i.e., 8×4 memory cells. In this setting, the maximum X address value is #7, i.e, lower three bits are valid by masking fourth or higher bits. The maximum Y address value is #3, i.e., lower two bits are valid by masking third or higher bits, which is the same as the previous example.

It is also assumed that the X address and Y address both start from 0, and the set value for the diagonal inversion set register 10 is "#3", which is the same as in the previous example of FIG. 4. The expected memory cell locations that their write data should be inverted are shown by cross marks in FIG. 5. FIG. 6 shows actual memory cell locations resulted from the operation of the circuit diagram of FIG. 2B.

Based on the conditions mentioned above, the process of determining whether the write data for a memory cell defined by the address data should be inverted is described in the following for each and every X, Y address. This process is conducted by computing the right and left of the conditional equation 1 above, and when the computed results match with each other, it is determined that the write data for the address is inverted.

First, the computation results for the addresses from (X, Y)=(0, 0) to (X, Y)=(3, 0) are the same as that described above with reference to FIG. 4, thus, the explanation for these addresses is omitted here.

Second, when the address of a memory cell is (x, Y)=(4, 0), the conditional equation of left side "(Y address of memory cell+diagonal inversion set value) AND maximum Y address value" is (0+3) AND 3=3, and the conditional equation of right side "(X address of memory cell AND maximum X address value)" is 4 AND 7=4, thus, left side≠right side. Therefore, the data is not inverted for the memory cell. Note that since the lower three bits are valid in the right side (X address), "4 AND 7" above is "100 AND 111" which is "100" in binary form, i.e., "4". Similar rule applies to the following descriptions.

Third, when the address of a memory cell is (X, Y)=(5, 0), the conditional equation of left side "(Y address of memory cell+diagonal inversion set value) AND maximum Y address value" is (0+3) AND 3=3, and the conditional equation of right side "(X address of memory cell AND maximum X address value)" is 5 AND 7=5, thus, left side≠right side. Therefore, the data is not inverted for this memory cell.

Fourth, when the address of a memory cell is (X, Y)=(6, 0), the conditional equation of left side "(Y address of memory cell+diagonal inversion set value) AND maximum Y address value" is (0+3) AND 3=3, and the conditional equation of right side "(X address of memory cell AND maximum X address value)" is 6 AND 7=6, thus, left side≠right side. Therefore, the data is not inverted for the memory cell.

Fifth, when the address of a memory cell is (X, Y)=(7, 0), the conditional equation of left side "(Y address of memory cell+diagonal inversion set value) AND maximum Y address value" is (0+3) AND 3=3, and the conditional equation of right side "(X address of memory cell AND maximum X address value)" is 7 AND 7=7, thus, left side≠right side. Therefore, the data is not inverted for this memory cell.

Sixth, the computation results for the addresses from (X, Y)=(0, 1) to (X, Y)=(3, 1) are the same as that described above with reference to FIG. 4, thus, the explanation for these addresses is omitted here.

Seventh, when the address of a memory cell is (x, Y)=(4, 1), the conditional equation of left side "(Y address of memory cell+diagonal inversion set value) AND maximum Y address value" is (1+3) AND 3=0, and the conditional equation of right side "(X address of memory cell AND maximum X address value)" is 4 AND 7=4, thus, left side≠right side. Therefore, the data is not inverted for the memory cell. As shown in FIG. 5, it is intended that the write data for this memory cell be inverted, which results in discrepancy in the example of FIG. 2B.

Eighth, when the address of a memory cell is (X, Y)=(5, 1), the conditional equation of left side "(Y address of memory cell+diagonal inversion set value) AND maximum Y address value" is (1+3) AND 3=0, and the conditional equation of right side "(X address of memory cell AND maximum X address value)" is 5 AND 7=5, thus, left side≠right side. Therefore, the data is not inverted for this memory cell.

Ninth, when the address of a memory cell is (x, Y)=(6, 1), the conditional equation of left side "(Y address of memory cell+diagonal inversion set value) AND maximum Y address value" is (1+3) AND 3=0, and the conditional equation of right side "(X address of memory cell AND maximum X address value)" is 6 AND 7=6, thus, left side≠right side. Therefore, the data is not inverted for the memory cell.

Tenth, when the address of a memory cell is (x, Y)=(7, 1), the conditional equation of left side "(Y address of memory cell+diagonal inversion set value) AND maximum Y address value" is (1+3) AND 3=0, and the conditional equation of right side "(X address of memory cell AND maximum X address value)" is 7 AND 7=7, thus, left side≠right side. Therefore, the data is not inverted for the memory cell.

Eleventh, the computation results for the addresses from (X, Y)=(0, 2) to (X, Y)=(3, 2) are the same as that described above with reference to FIG. 4, thus, the explanation for these addresses is omitted here.

Twelfth, when the address of a memory cell is (X, Y)=(4, 2), the conditional equation of left side "(Y address of memory cell+diagonal inversion set value) AND maximum Y address value" is (2+3) AND 3=1, and the conditional equation of right side "(X address of memory cell AND maximum X address value)" is 4 AND 7=4, thus, left side≠right side. Therefore, the data is not inverted for the memory cell.

Thirteenth, when the address of a memory cell is (X, Y)=(5, 2), the conditional equation of left side "(Y address of memory cell+diagonal inversion set value) AND maximum Y address value" is (2+3) AND 3=1, and the conditional equation of right side "(X address of memory cell+ maximum X address value)" is 5 AND 7=5, thus, left side≠right side. Therefore, the data is not inverted for the memory cell. However, as shown in FIG. 5, it is intended that the write data for this memory cell be inverted, which results in discrepancy in the example of FIG. 2B.

Fourteenth, when the address of a memory cell is (X, Y)=(6, 2), the conditional equation of left side "(Y address of memory cell+diagonal inversion set value) AND maximum Y address value" is (2+3) AND 3=1, and the conditional equation of right side "(X address of memory cell AND maximum X address value)" is 6 AND 7=6, thus, left side≠right side. Therefore, the data is not inverted for the memory cell.

Fifteenth, when the address of a memory cell is (X, Y)=(7, 2), the conditional equation of left side "(Y address of memory cell+diagonal inversion set value) AND maximum Y address value" is (2+3) AND 3=1, and the conditional equation of right side "(X address of memory cell AND maximum X address value)" is 7AND 7=7, thus, left side≠right side. Therefore, the data is not inverted for the memory cell.

Sixteenth, the computation results for the addresses from (X, Y)=(0, 3) to (X, Y)=(3, 3) are the same as that described above with reference to FIG. 4, thus, the explanation for these addresses is omitted here.

Seventeenth, when the address of a memory cell is (X, Y)=(4, 3), the conditional equation of left side "(Y address of memory cell+diagonal inversion set value) AND maximum Y address value" is (3+3) AND 3=2, and the conditional equation of right side "(X address of memory cell AND maximum X address value)" is 4 AND7=4, thus, left side≠right side. Therefore, the data is not inverted for the memory cell.

Eighteenth, when the address of a memory cell is (X, Y)=(5, 3), the conditional equation of left side "(Y address of memory cell+diagonal inversion set value) AND maximum Y address value" is (3+3) AND 3=2, and the conditional equation of right side "(x address of memory cell+ maximum X address value)" is 5 AND 7=5, thus, left side≠right side. Therefore, the data is not inverted for the memory cell.

Nineteenth, when the address of a memory cell is (X, Y)=(6, 3), the conditional equation of left side "(Y address of memory cell+diagonal inversion set value) AND maximum Y address value" is (3 +3) AND 3=2, and the conditional equation of right side "(X address of memory cell+ maximum X address value)" is 6 AND 7=6, thus, left side≠right side. Therefore, the data is not inverted for this memory cell. However, as shown in FIG. 5, it is intended that the write data for this memory cell be inverted, which results in discrepancy in the example of FIG. 2B.

Twentieth, when the address of a memory cell is (X, Y)=(7, 3), the conditional equation of left side "(Y address of memory cell+diagonal inversion set value) AND maximum Y address value" is (3+3) AND 3=2, and the conditional equation of right side "(X address of memory cell AND maximum X address value)" is 7 AND 7=7, thus, left side≠right side. Therefore, the data is not inverted for this memory cell.

From the above explained computation results, it is seen that an inversion request signal 110s is not produced due to the mismatch of the left and right side of the equation in the results at fifth, seventh, thirteenth, and nineteenth computations. Therefore, it is obvious that an appropriate inversion operation is not available at the four intended memory locations as shown in FIG. 6. Thus, in the case where the memory device under test has an array of memory cells with different number of cells between the X and Y directions, there arises a problem that the diagonal inversion will not function properly.

To attain the inversion operation for all of the intended locations of the memory cells, it is necessary to produce a complicated test program, which requires a considerable amount of time and work. Further, because such an approach of using a test program makes it impossible of continuously and automatically reading and writing the memory device under test, test throughput is substantially decreased, resulting in increase in the cost of memory devices.

SUMMARY OF THE INVENTION

It is, therefore, an object of the present invention to provide a pattern generator for a semiconductor test system which is capable of correctly generating an inversion request signal even if the memory device under test has different total numbers of memory cells between row (X) and column (Y) directions.

It is another object of the present invention to provide a pattern generator for a semiconductor test system which is capable of inverting write data for memory cells on a specified diagonal line of a memory device under test without using a test program.

It is a further object of the present invention to provide a pattern generator for a semiconductor test system which is capable of testing semiconductor memory devices with high test throughput and low cost.

In order to solve the above problems, in the present invention, a pattern generator in a semiconductor test system for generating test patterns for testing a semiconductor memory device includes an inversion request signal circuit for generating an inversion request signal for each specified memory cell of the DUT for inverting write data to the specified memory cell in such a way that locations of specified memory cells are on a diagonal line on an array of memory cells in the semiconductor memory device wherein the numbers of overall memory cells in row (X) and column (Y) are different from each other.

In the present invention, even if the memory device under test has different numbers of memory cells in the row (X) and column (Y) directions, the semiconductor test system is able to perform data inversion operation correctly in response to the address data and the inversion request signal generated by the pattern generator.

The inversion request signal circuit in the pattern generator includes a diagonal inversion set register for storing a set value defining locations of diagonal lines on the array of memory cells, an accumulator for adding Y address data for the memory device under test and the set value from the register, a Y AND gate provided with the output of the accumulator, maximum Y address value, and maximum X address value, an X AND gate provided with X address data for the memory device under test, the maximum Y address value, and the maximum X address value, and a comparator for comparing outputs of the Y AND gate and X AND gate and generates the inversion request signal when the outputs of the AND gates match with each other.

Further aspect of the present invention is a method of generating a test pattern for testing a memory device including a process of inverting the write data. The process of inverting the write data for the memory cell on the specified diagonal line (diagonal inversion) is conducted based on the following equation:

(Y address of memory cell+diagonal inversion set value) AND (maximum X address value AND maximum Y address value)=X address of memory cell AND (maximum X address value AND maximum Y address value)    Equation 3:

In the further aspect, the method of generating test pattern of the present invention is to perform a reverse diagonal inversion function wherein a diagonal line is perpendicular to the diagonal line of the equation 3. The process of inverting the write data for the memory cell on the specified diagonal line (reverse diagonal inversion) is conducted based on the following equation:

*(X address of memory cell+diagonal inversion set value) AND (maximum X address value & maximum Y address value)=Y address of memory cell AND (maximum X address value AND maximum Y address value)    Equation 4:

Here, the mark * at the front of the equation 4 indicates bit inversion which inverts the data indicating the added result within the parentheses that comes immediately after the mark.

According to the present invention, the pattern generator for semiconductor test system is capable of correctly generating an inversion request signal even if the memory device under test has different total numbers of memory cells between X and Y directions. The pattern generator is able to invert the write data for memory cells on a specified diagonal line of the memory device without using a specific test program. Therefore, the present invention can improve test performance of memory devices with high test throughput and low cost.

The present invention is applicable to any semiconductor memory devices, such as stand-alone memory devices or memory blocks incorporated in other integrated circuit chip, or memory cores embedded in a system-on-a-chip, and etc. The present invention is able to invert the write data for memory devices having either an identical row (X) and column (Y) structure or a different row (X) and column (Y) structure. It is apparent for a person skilled in the art that the terms row (X) and column (Y) used in the description of the present invention are interchangeable with each other.

BRIEF DESCRIPTION OF THE DRAWINGS

FIGS. 3A and 3B are schematic diagrams showing examples of relationship between neighborhood memory cells and specified memory cells on a diagonally line for writing inverted data therein.

DETAILED DESCRIPTION OF THE INVENTION

Figure 7:
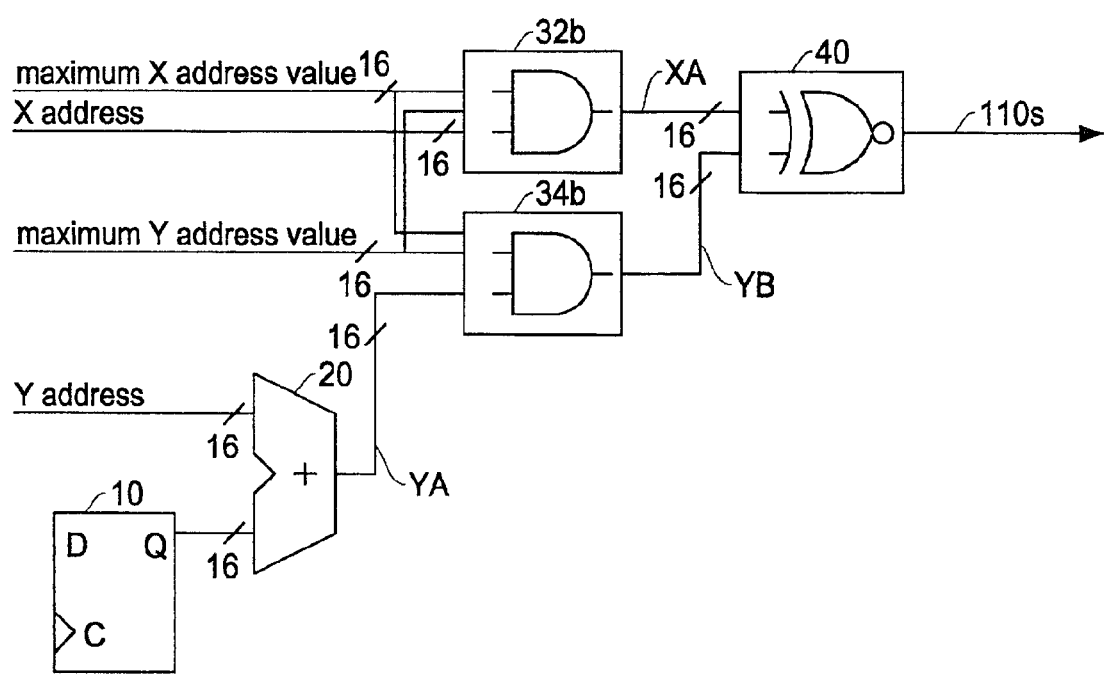
FIG. 7 is a block diagram showing an example of essential components constituting an inversion request signal circuit incorporated in the pattern generator of the present invention.
Figure 8:
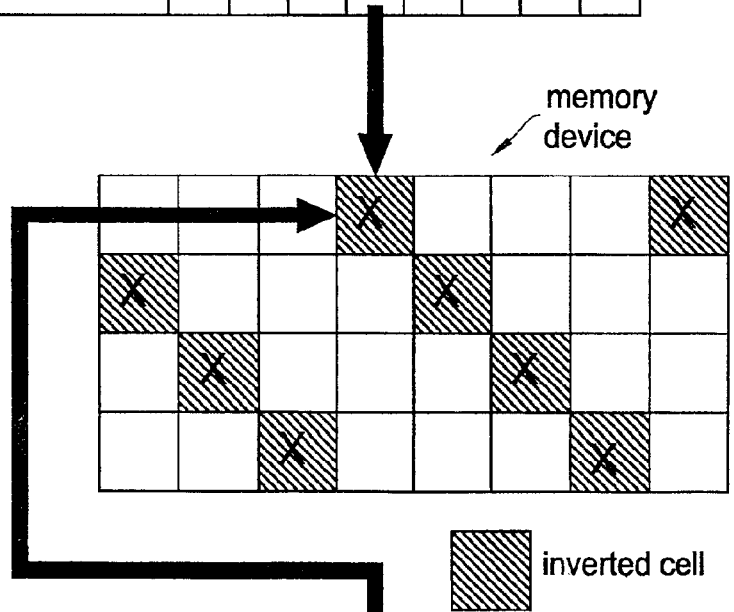
FIG. 8 is a schematic diagram showing the relationship between the right and left side of the conditional equation depicting the operation of the circuit of FIG. 7 and the array of memory cells in the memory device of FIG. 5.

Referring now to FIG. 7, there is shown an inversion request signal circuit in a pattern generator in accordance with the present invention. The effect of the present invention using the circuit diagram of FIG. 7 is shown in the schematic diagram of FIG. 8. As shown in FIGS. 7 and 8, write data for specified memory cells in a diagonal line is correctly inverted when the memory device has different numbers of total memory cells between the X (row) and Y (column) directions.

Figure 1:
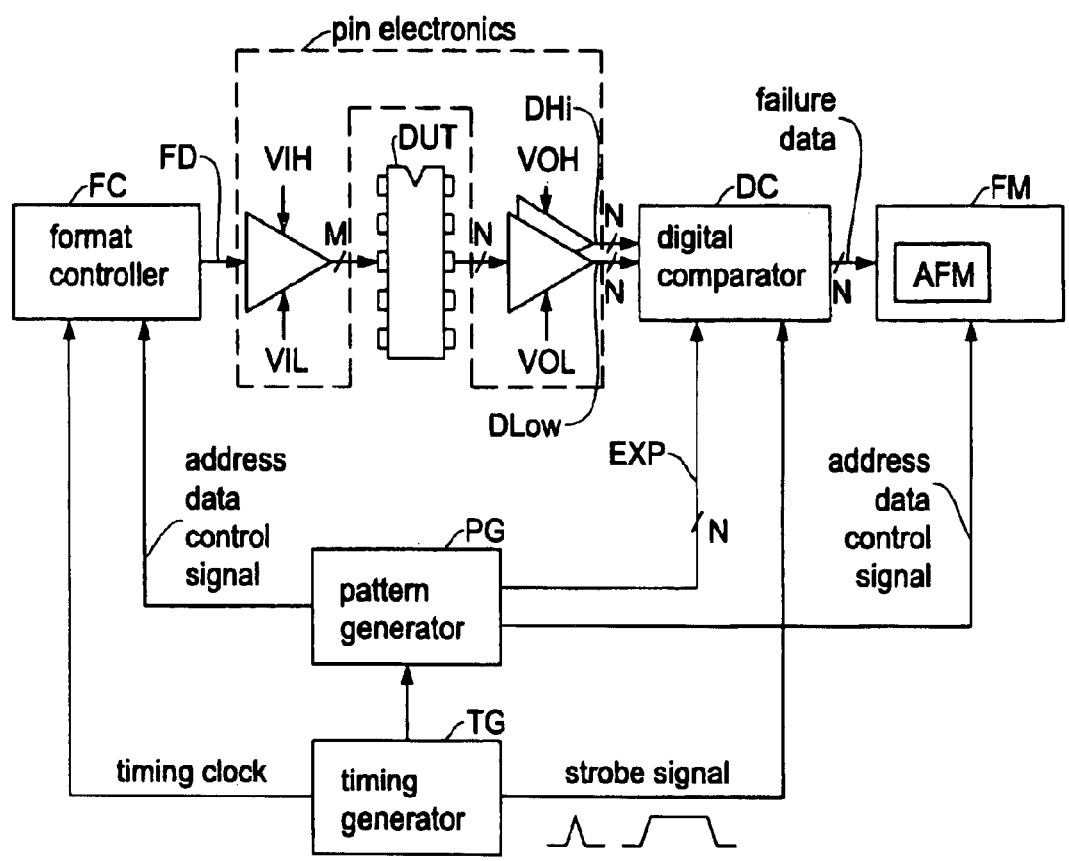
FIG. 1 is a schematic block diagram showing an basic structure of a semiconductor test system including a pattern generator.
Figure 2A:
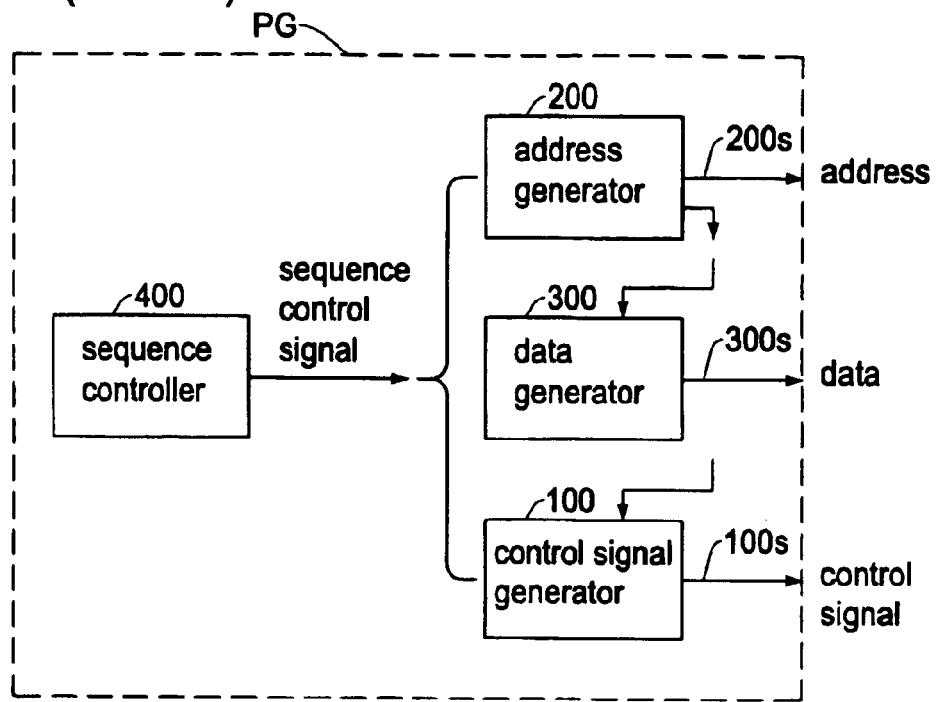
FIG. 2A is a schematic block diagram showing an example of basic structure in a pattern generator PG.
Figure 2B:
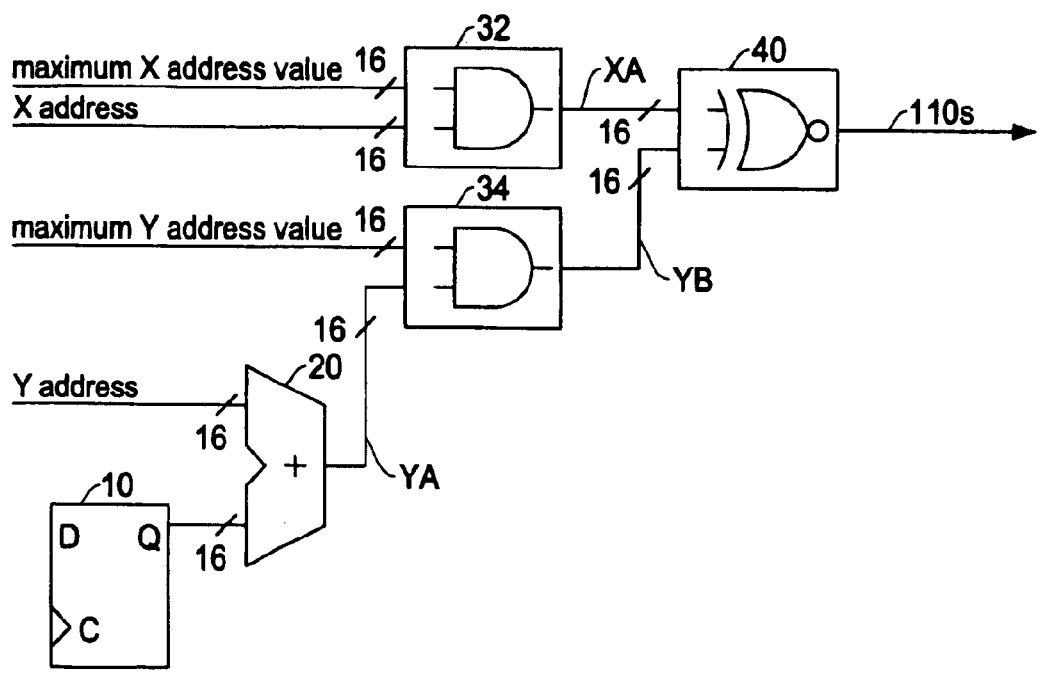
FIG. 2B is a block diagram showing an example of essential components constituting an inversion request signal circuit in the conventional technology which is an internal knowledge of the inventor and assignee but not the prior art against the present invention.
Figure 4:
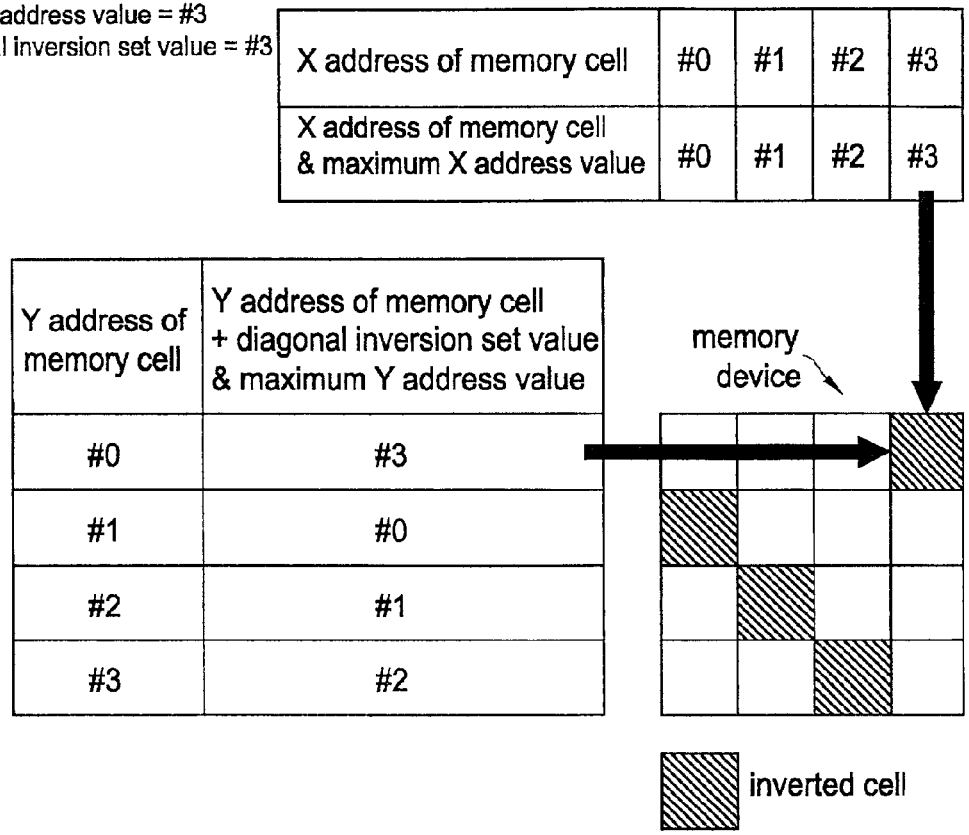
FIG. 4 is a schematic diagram showing the relationship between the right and left side of the conditional equation based on the circuit diagram of FIG. 2B and the array of memory cells in a memory device under test.

The circuit diagram of FIG. 7 is to generate an inversion request signal 110s when prescribed conditions are met. The example of FIG. 7 has a configuration similar to that of FIG. 2B. The basic difference from FIG. 2B resides in that an X AND gate 32b is additionally provided with the maximum Y address value and a Y AND gate 34b is additionally provided with the maximum X address value. The other elements are the same as that shown in FIG. 2B, thus no further explanation will be given here for the same elements. It should be noted that the notation of X (row) and Y (column) are used for convenience of explanation, such X and Y are freely interchangeable in the present invention.

The Y AND gate 34b supplies 16-bit output results of logic AND operation performed among the 16-bit maximum Y address value, 16-bit maximum X address value, and the 16-bit width Y address signal, to the comparator 40 as Y comparison data YB. The X AND gate 32b supplies 16-bit output results of logic AND operation performed among the 16-bit maximum X address value, 16-bit maximum Y address value, and the 16-bit width X address signal, to the comparator 40 as X comparison data XA.

The comparator 40 receives the 16-bit width Y comparison data YB and the 16-bit width X comparison data XA, compares each and every corresponding bit therebetween, and generates an inversion request signal only when all of the bits matched with one another. As a result of this process, the write data for specified memory cells in the DUT is automatically inverted and written therein. In addition, the expected data provided to the digital comparator DC is inverted accordingly so that the logic comparison with the read out data of the DUT can be conducted correctly. The information on the data inversion is provided to the address fail memory AFM to be used for failure analysis.

Under the configuration of FIG. 7, a diagonal inversion function is conducted under the following conditional equation 3.

(Y address of memory cell+diagonal inversion set value) AND (maximum X address value AND maximum Y address value)=X address of memory cell AND (maximum X address value AND maximum Y address value) Conditional equation 3:

Moreover, it is possible to perform a reverse diagonal inversion function wherein a diagonal line is perpendicular to the diagonal line of the equation 3 under the following conditional equation 4.

*(X address of memory cell+diagonal inversion set value) AND (maximum X address value & maximum Y address value)=Y address of memory cell AND (maximum X address value AND maximum Y address value)  Conditional equation 4

Here, the mark * at the front of the equation 4 indicates that bit inversion should be made to invert the data of the added result within the parentheses that comes immediately after the mark.

Figure 5:
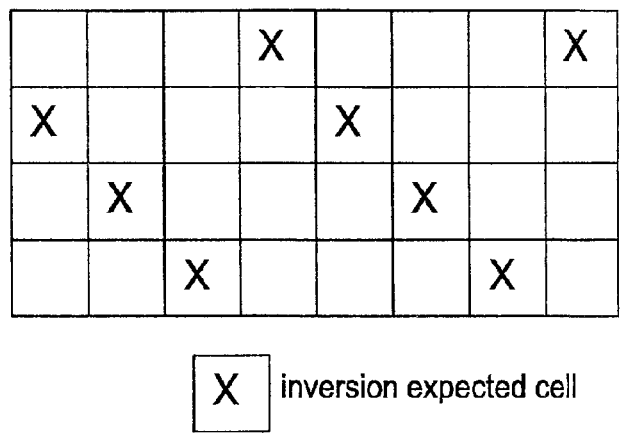
FIG. 5 is a schematic diagram showing the locations of memory cells in a diagonal line for which the write data is inverted when the memory device has different numbers of memory cells between X and Y directions.
Figure 6:
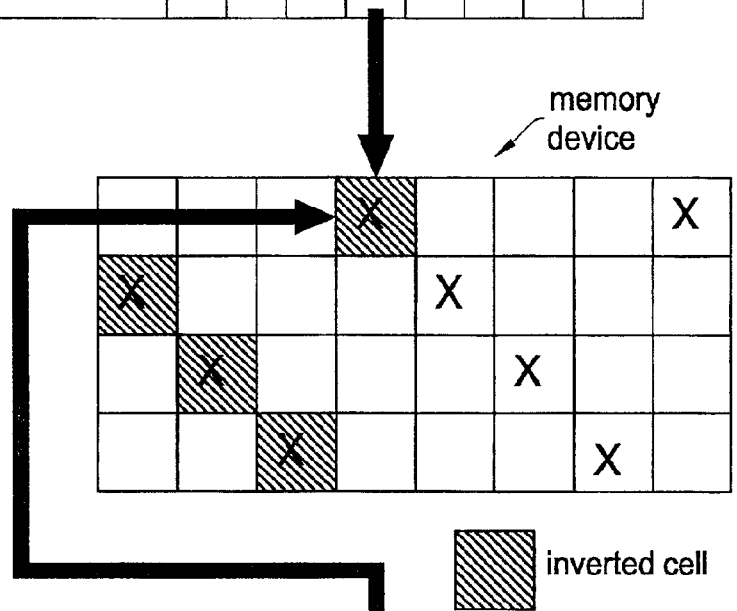
FIG. 6 is a schematic diagram showing the relationship between the right and left side of the conditional equation depicting the operation of the circuit of FIG. 2B and the array of memory cells in the memory device of FIG. 5.

With reference to FIG. 8, an example of procedure of the diagonal inversion operation is described herewith based on the circuit diagram of FIG. 7, i.e., the conditional equation 3, for generating an inversion request signal 110s. The following description is made for the case where the memory device under test has an array of 8×4 memory cell as shown in FIGS. 5, 6 and 8. In this setting, the maximum X address value is #7, i.e, lower three bits are valid by masking fourth or higher bits. The maximum Y address value is #3, i.e., lower two bits are valid by masking third or higher bits, which is the same as the previous example. It is assumed that the X address and Y address both start from "#0", and the set value for the diagonal inversion set register 10 is "#3".

Based on the conditions mentioned above, the process of determining whether the write data for a memory cell defined by the address data should be inverted is described in the following for each and every X and Y address. This process is conducted by computing the right and left of the conditional equation 3 above, and when the computed results match with each other, it is determined that the write data for the address is inverted. The hatched portions in FIG. 8 indicate the memory cell locations where the write data is inverted based on the pattern generator of the present invention.

First, when the address of a memory cell is (X, Y)=(0, 0), the conditional equation of left side "(Y address of memory cell+diagonal inversion set value) AND (maximum X address value AND maximum Y address value)" is (0+3) AND 7 AND 3=3, and the conditional equation of right side "X address of memory cell AND (maximum X address value AND maximum Y address value)" is 0 AND 7 AND 3=0, thus, left side≠right side. Therefore, the data is not inverted for the memory cell.

Second, when the address of a memory cell is (X, Y)=(1, 0), the conditional equation of left side "(Y address of memory cell+diagonal inversion set value) AND (maximum X address value AND maximum Y address value)" is (0+3) AND 7 AND 3=3, and the conditional equation of right side "X address of memory cell AND (maximum X address value AND maximum Y address value)" is 1 AND 7 AND 3=1, thus, left side≠X right side. Therefore, the data is not inverted for the memory cell.

Third, when the address of a memory cell is (X, Y)=(2, 0), the conditional equation of left side "(Y address of memory cell+diagonal inversion set value) AND (maximum X address value AND maximum Y address value)" is (0+3) AND 7 AND 3=3, and the conditional equation of right side "X address of memory cell AND (maximum X address value AND maximum Y address value)" is 2 AND 7 AND 3=2, thus, left side ≠X right side. Therefore, the data is not inverted for the memory cell.

Fourth, when the address of a memory cell is (X, Y)=(3, 0), the conditional equation of left side "(Y address of memory cell+diagonal inversion set value) AND (maximum X address value AND maximum Y address value)" is (0+3) AND 7 AND 3=3, and the conditional equation of right side "X address of memory cell AND (maximum X address value AND maximum Y address value)" is 3 AND 7 AND 3=3, thus, left side=right side. Therefore, the data is inverted for this memory cell.

Fifth, when the address of a memory cell is (X, Y)=(4, 0), the conditional equation of left side "(Y address of memory cell+diagonal inversion set value) AND (maximum X address value AND maximum Y address value)" is (0+3) AND 7 AND 3=3, and the conditional equation of right side "X address of memory cell AND (maximum X address value AND maximum Y address value)" is 4 AND 7 AND 3=0, thus, left side≠right side. Therefore, the data is not inverted in the memory cell.

Sixth, when the address of a memory cell is (X, Y)=(5, 0), the conditional equation of left side "(Y address of memory cell+diagonal inversion set value) AND (maximum X address value AND maximum Y address value)" is (0+3) AND 7 AND 3=3, and the conditional equation of right side "X address of memory cell AND (maximum X address value AND maximum Y address value)" is 5 AND 7 AND 3=1, thus, left side≠X right side. Therefore, the data is not inverted for the memory cell.

Seventh, when the address of a memory cell is (X, Y)=(6, 0), the conditional equation of left side "(Y address of memory cell+diagonal inversion set value) AND (maximum X address value AND maximum Y address value)" is (0+3) AND 7 AND 3=3, and the conditional equation of right side "X address of memory cell AND (maximum X address value AND maximum Y address value)" is 6 AND 7 AND 3=2, thus, left side≠right side. Therefore, the data is not inverted for the memory cell.

Eighth, when the address of a memory cell is (X, Y)=(7, 0), the conditional equation of left side "(Y address of memory cell+diagonal inversion set value) AND (maximum X address value AND maximum Y address value)" is (0+3) AND 7 AND 3=3, and the conditional equation of right side "X address of memory cell AND (maximum X address value AND maximum Y address value)" is 7 AND 7 AND 3=3, thus, left side=right side. Therefore, the data is inverted for this memory cell.

Ninth, when the address of a memory cell is (X, Y)=(0, 1), the conditional equation of left side "(Y address of memory cell+diagonal inversion set value) AND (maximum X address value AND maximum Y address value)" is (1+3) AND 7 AND 3=0, and the conditional equation of right side "X address of memory cell AND (maximum X address value AND maximum Y address value)" is 0 AND 7 AND 3=0, thus, left side=right side. Therefore, the data is inverted for this memory cell.

Tenth, when the address of a memory cell is (X, Y)=(1, 1), the conditional equation of left side "(Y address of memory cell+diagonal inversion set value) AND (maximum X address value AND maximum Y address value)" is (1+3) AND 7 AND 3=0, and the conditional equation of right side "X address of memory cell AND (maximum X address value AND maximum Y address value)" is 1 AND 7 AND 3=1, thus, left side≠X right side. Therefore, the data is not inverted for the memory cell.

Eleventh, when the address of a memory cell is (X, Y)=(2, 1), the conditional equation of left side"(Y address of memory cell+diagonal inversion set value) AND (maximum X address value AND maximum Y address value)" is (1+3) AND 7 AND 3=0, and the conditional equation of right side "X address of memory cell AND (maximum X address value AND maximum Y address value)" is 2 AND 7 AND 3=2, thus, left side≠right side. Therefore, the data is not inverted for the memory cell.

Twelfth, when the address of a memory cell is (X, Y)=(3, 1), the conditional equation of left side (Y address of memory cell+diagonal inversion set value) AND (maximum X address value AND maximum Y address value)" is (1+3) AND 7 AND 3=0, and the conditional equation of right side "X address of memory cell AND (maximum X address value AND maximum Y address value)" is 3 AND 7 AND 3=3, thus, left side≠right side. Therefore, the data is not inverted for the memory cell.

Thirteenth, when the address of a memory cell is (X, Y)=(4, 1), the conditional equation of left side "(Y address of memory cell+diagonal inversion set value) AND (maximum X address value AND maximum Y address value)" is (1+3) AND 7 AND 3=0, and the conditional equation of right side "X address of memory cell AND (maximum X address value AND maximum Y address value)" is 4 AND 7 AND 3=0, thus, left side=right side. Therefore, the data is inverted for this memory cell.

Fourteenth, when the address of a memory cell is (X, Y)=(5, 1), the conditional equation of left side "(Y address of memory cell+diagonal inversion set value) AND (maximum X address value AND maximum Y address value)" is (1+3) AND 7 AND 3=0, and the conditional equation of right side "X address of memory cell AND (maximum X address value AND maximum Y address value)" is 5 AND 7 AND 3=1, thus, left side≠right side. Therefore, the data is not inverted for the memory cell.

Fifteenth, when the address of a memory cell is (X, Y)=(6, 1), the conditional equation of left side "(Y address of memory cell+diagonal inversion set value) AND (maximum X address value AND maximum Y address value)" is (1+3) AND 7 AND 3=0, and the conditional equation of right side "X address of memory cell AND (maximum X address value AND maximum Y address value)" is 6 AND 7 AND 3=2, thus, left side≠right side. Therefore, the data is not inverted for the memory cell.

Sixteenth, when the address of a memory cell is (X, Y)=(7, 1), the conditional equation of left side "(Y address of memory cell+diagonal inversion set value) AND (maximum X address value AND maximum Y address value)" is (1+3) AND 7 AND 3=0, and the conditional equation of right side "X address of memory cell AND (maximum X address value AND maximum Y address value)" is 7 AND 7 AND 3=3, thus, left side≠right side. Therefore, the data is not inverted for the memory cell.

Seventeenth, when the address of a memory cell is (X, Y)=(0, 2), the conditional equation of left side "(Y address of memory cell+diagonal inversion set value) AND (maximum X address value AND maximum Y address value)" is (2+3) AND 7 AND 3=1, and the conditional equation of right side "X address of memory cell AND (maximum X address value AND maximum Y address value)" is 0 AND 7 AND 3=0, thus, left side≠right side. Therefore, the data is not inverted for the memory cell.

Eighteenth, when the address of a memory cell is (X, Y)=(1, 2), the conditional equation of left side "(Y address of memory cell+diagonal inversion set value) AND (maximum X address value AND maximum Y address value)" is (2+3) AND 7 AND 3=1, and the conditional equation of right side "X address of memory cell AND (maximum X address value AND maximum Y address value)" is 1 AND 7 AND 3=1, thus, left side=right side. Therefore, the data is inverted for this memory cell.

Nineteenth, when the address of a memory cell is (X, Y)=(2, 2), the conditional equation of left side "(Y address of memory cell+diagonal inversion set value) AND (maximum X address value AND maximum Y address value)" is (2+3) AND 7 AND 3=1, and the conditional equation of right side "X address of memory cell AND (maximum X address value AND maximum Y address value)" is 2 AND 7 AND 3=2, thus, left side≠right side. Therefore, the data is not inverted for the memory cell.

Twentieth, when the address of a memory cell is (X, Y)=(3, 2), the conditional equation of left side "(Y address of memory cell+diagonal inversion set value) AND (maximum X address value AND maximum Y address value)" is (2+3) AND 7 AND 3=1, and the conditional equation of right side "X address of memory cell AND (maximum X address value AND maximum Y address value)" is 3 AND 7 AND 3=3, thus, left side≠right side. Therefore, the data is not inverted for the memory cell.

Twenty-first, when the address of a memory cell is (X, Y)=(4, 2), the conditional equation of left side "(Y address of memory cell+diagonal inversion set value) AND (maximum X address value AND maximum Y address value)" is (2+3) AND 7 AND 3=1, and the conditional equation of right side "X address of memory cell AND (maximum X address value AND maximum Y address value" is 4 AND 7 AND 3=0, thus, left side≠right side. Therefore, the data is not inverted for the memory cell.

Twenty-second, when the address of a memory cell is (X, Y)=(5, 2), the conditional equation of left side "(Y address of memory cell+diagonal inversion set value) AND (maximum X address value AND maximum Y address value)" is (2 +3) AND 7 AND 3=1, and the conditional equation of right side "X address of memory cell AND (maximum X address value AND maximum Y address value)" is 5 AND 7 AND 3=1, thus, left side=right side. Therefore, the data is inverted for this memory cell.

Twenty-third, when the address of a memory cell is (X, Y)=(6, 2), the conditional equation of left side "(Y address of memory cell+diagonal inversion set value) AND (maximum X address value AND maximum Y address value)" is (2 +3) AND 7 AND 3=1, and the conditional equation of right side "X address of memory cell AND (maximum X address value AND maximum Y address value)" is 6 AND 7 AND 3=2, thus, left side≠right side. Therefore, the data is not inverted for the memory cell.

Twenty-fourth, when the address of a memory cell is (X, Y)=(7, 2), the conditional equation of left side "(Y address of memory cell+diagonal inversion set value) AND (maximum X address value AND maximum Y address value)" is (2 +3) AND 7 AND 3=1, and the conditional equation of right side "X address of memory cell AND (maximum X address value AND maximum Y address value)" is 3 AND 3 AND 3=3, thus, left side≠right side. Therefore, the data is not inverted for the memory cell.

Twenty-fifth, when the address of a memory cell is (X, Y)=(0, 3), the conditional equation of left side "(Y address of memory cell+diagonal inversion set value) AND (maximum X address value AND maximum Y address value)" is (3 +3) AND 7 AND 3=2, and the conditional equation of right side "X address of memory cell AND (maximum X address value AND maximum Y address value)" is 0 AND 7 AND 3=0, thus, left side≠right side. Therefore, the data is not inverted for the memory cell.

Twenty-sixth, when the address of a memory cell is (X, Y)=(1, 3), the conditional equation of left side "(Y address of memory cell+diagonal inversion set value) AND (maximum X address value & maximum Y address value)" is (3+3) AND 7 AND 3=2, and the conditional equation of right side "X address of memory cell AND (maximum X address value AND maximum Y address value)" is 1 AND 7 AND 3=1, thus, left side≠right side. Therefore, the data is not inverted for the memory cell.

Twenty-seventh, when the address of a memory cell is (X, Y)=(2, 3), the conditional equation of left side "(Y address of memory cell+diagonal inversion set value) AND (maximum X address value AND maximum Y address value)" is (3 +3) AND 7 AND 3=2, and the conditional equation of right side "X address of memory cell AND (maximum X address value AND maximum Y address value)" is 2 AND 7 AND 3=2, thus, left side=right side. Therefore, the data is inverted for this memory cell.

Twenty-eighth, when the address of a memory cell is (X, Y)=(3, 3), the conditional equation of left side "(Y address of memory cell+diagonal inversion set value) AND (maximum X address value AND maximum Y address value)" is (3 +3) AND 7 AND 3=2, and the conditional equation of right side "X address of memory cell AND (maximum X address value AND maximum Y address value)" is 3 AND 7 AND 3=3, thus, left side≠right side. Therefore, the data is not inverted for the memory cell.

Twenty-ninth, when the address of a memory cell is (X, Y)=(4, 3), the conditional equation of left side "(Y address of memory cell+diagonal inversion set value) AND (maximum X address value AND maximum Y address value)" is (3 +3) AND 7 AND 3=2, and the conditional equation of right side "X address of memory cell AND (maximum X address value AND maximum Y address value)" is 4 AND 7 AND 3=0, thus, left side≠right side. Therefore, the data is not inverted for the memory cell.

Thirtieth, when the address of a memory cell is (X, Y)=(5, 3), the conditional equation of left side "(Y address of memory cell+diagonal inversion set value) AND (maximum X address value AND maximum Y address value)" is (3+3) AND 7 AND 3=2, and the conditional equation of right side "X address of memory cell AND (maximum X address value AND maximum Y address value)" is 5 AND 7 AND 3=1, thus, left side≠right side. Therefore, the data is not inverted for the memory cell.

Thirty-first, when the address of a memory cell is (X, Y)=(6, 3), the conditional equation of left side "(Y address of memory cell+diagonal inversion set value) AND (maximum X address value AND maximum Y address value)" is (3 +3) AND 7 AND 3=2, and the conditional equation of right side "X address of memory cell AND (maximum X address value AND maximum Y address value)" is 6 AND 7 AND 3=2, thus, left side=right side. Therefore, the data is inverted for this memory cell.

Thirty-second, when the address of a memory cell is (X, Y)=(7, 3), the conditional equation of left side "(Y address of memory cell+diagonal inversion set value) AND (maximum X address value AND maximum Y address value)" is (3 +3) AND 7 AND 3=2, and the conditional equation of right side "X address of memory cell AND (maximum X address value AND maximum Y address value)" is 7 AND 7 AND 3=3, thus, left side≠right side. Therefore, the data is not inverted for the memory cell.

From the above computation results, in the fourth, eighth, ninth, thirteenth, eighteenth, twenty-second, twenty-seventh, and thirty-first, the left and right side computations match with each other. Thus, an inversion request signal 110s is generated by the circuit of FIG. 7, thereby fulfilling an intended inversion operation as shown by the hatched portions in FIG. 8. Note that the locations of the memory cells for inverting the write data are on the diagonal lines of the memory cell array which can be changed by changing the set value in the diagonal inversion set register 10 in FIG. 7.

The foregoing description has been made for performing the conditional equation 3 implemented in the circuit diagram of FIG. 7. The present invention is not limited to the specific example described above. For example, a reverse diagonal inversion operation defined by the conditional equation 4 which establishes diagonal lines perpendicular to that of the conditional equation 3 can be achieved.

As has been described above, according to the present invention, the pattern generator for semiconductor test system is capable of correctly generating an inversion request signal even if the memory device under test has different numbers of total memory cells between X and Y directions. The pattern generator is able to invert the write data for memory cells on a specified diagonal line of the memory device without using a specific test program. Therefore, the present invention can improve test performance of memory devices with high test throughput and low cost.

The present invention is applicable to any semiconductor memory devices, such as stand-alone memory devices or memory blocks incorporated in other integrated circuit chip, or memory cores embedded in a system-on-a-chip, and etc. The present invention is able to invert the write data for memory devices having either an identical row (X) and column (Y) structure or a different row (X) and column (Y) structure. It is apparent for a person skilled in the art that the terms row (X) and column (Y) used in the description of the present invention are interchangeable with each other.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. A pattern generator in a semiconductor test system for generating test patterns for testing a semiconductor memory device, comprising:

an inversion request signal circuit for generating an inversion request signal for each specified memory cell of a semiconductor memory device under test for inverting write data to the specified memory cell;

wherein locations of specified memory cells are on a diagonal line on an array of memory cells in the semiconductor memory device under test, and wherein overall numbers of memory cells in a row (X) and column (Y) are different from each other;

wherein the pattern generator generates the test pattern that includes:
   address data for accessing the semiconductor memory device under test and a failure memory provided in the semiconductor test system for storing test results therein;
   control data for controlling an operation of the semiconductor memory device under test, and
   write data for being written in the semiconductor memory device under test at addresses defined by the address data.

2. A pattern generator in a semiconductor test system as defined in claim 1, wherein the inversion request signal circuit is comprised of:

a diagonal inversion set register for storing a set value defining locations of the diagonal lines on the array of memory cells;

an accumulator for adding Y address data for the semiconductor memory device under test and the set value from the register;

a Y AND gate provided with an output of the accumulator, a maximum Y address value, and a maximum X address value;

an X AND gate provided with X address data for the semiconductor memory device under test, the maximum Y address value, and the maximum X address value; and a comparator for comparing outputs of the Y AND gate and X AND gate and generates the inversion request signal when the outputs of the Y and X AND gates match with each other.

3. A pattern generator in a semiconductor test system as defined in claim 1, wherein the inversion request signal circuit operates to perform the following equation for each and every address of the semiconductor memory device under test:

($Y$ address of memory cell+diagonal inversion set value) AND (maximum $X$ address value AND maximum $Y$ address value)=$X$ address of memory cell AND (maximum $X$ address value AND maximum $Y$ address value)

wherein when the results of right side and left side of the equation match with one another, the inversion request signal circuit generates the inversion request signal, thereby inverting the write data to the specified memory cells of the semiconductor memory device under test.

4. A pattern generator in a semiconductor test system as defined in claim 1, wherein the inversion request signal circuit operates to perform the following equation for each and every address of the semiconductor memory device under test:

$$*(X \text{ address of memory cell} + \text{diagonal inversion set value}) \text{ AND } (\text{maximum } X \text{ address value \& maximum } Y \text{ address value}) = Y \text{ address of memory cell AND } (\text{maximum } X \text{ address value AND maximum } Y \text{ address value})$$

where the mark * indicates bit inversion which inverts the data indicating the added result within the parentheses that comes immediately after the mark; and wherein when the results of right side and left side of the equation match with one another, the inversion request signal circuit generates the inversion request signal, thereby inverting the write data to the specified memory cells of the semiconductor memory device under test.

5. A pattern generator in a semiconductor test system as defined in claim 1, wherein the write data inverted in response to the inversion request signal is also sent to a logic comparator provided in the semiconductor test system as expected data for comparing with output data of the memory device under test.

6. A pattern generator in a semiconductor test system as defined in claim 1, wherein the write data inverted in response to the inversion request signal is sent to a logic comparator provided in the semiconductor test system as expected data for comparing with output data of the memory device under test, and information on data inversion is provided to the failure memory to be stored therein.

7. A method of generating a test pattern for a semiconductor test system for testing a semiconductor memory device, comprising the following steps of:

generating address data for accessing a semiconductor memory device under test and a failure memory provided in the semiconductor test system for storing test results therein;

generating control data for controlling an operation of the semiconductor memory device under test;

generating write data for being written in the semiconductor memory device under test at addresses defined by the address data; and generating an inversion request signal by performing the following equation for each and every address of the semiconductor memory device under test:

$$(Y \text{ address of memory cell} + \text{diagonal inversion set value}) \text{ AND } (\text{maximum } X \text{ address value AND maximum } Y \text{ address value}) = X \text{ address of memory cell AND } (\text{maximum } X \text{ address value AND maximum } Y \text{ address value})$$

wherein when the results of right side and left side of the equation match with one another, the inversion request signal is generated to invert the write data to a memory cell of the semiconductor memory device under test specified by the X and Y address in the equation; and wherein locations of specified memory cells are on a diagonal line on an array of memory cells in the semiconductor memory device under test where overall numbers of memory cells in a row (X) and column (Y) are different from each other.

8. A method of generating a test pattern for a semiconductor test system for testing a semiconductor memory device, comprising the following steps of:

generating address data for accessing a semiconductor memory device under test and a failure memory provided in the semiconductor test system for storing test results therein;

generating control data for controlling an operation of the semiconductor memory device under test;

generating write data for being written in the semiconductor memory device under test at addresses defined by the address data; and generating an inversion request signal by performing the following equation for each and every address of the memory device under test:

$$*(X \text{ address of memory cell} + \text{diagonal inversion set value}) \text{ AND } (\text{maximum } X \text{ address value \& maximum } Y \text{ address value}) = Y \text{ address of memory cell AND } (\text{maximum } X \text{ address value AND maximum } Y \text{ address value})$$

where the mark * indicates bit inversion which inverts the data indicating the added result within the parentheses that comes immediately after the mark; and wherein when the results of right side and left side of the equation match with one another, the inversion request signal is generated to invert write data to a memory cell of the semiconductor memory device under test specified by the X and Y address in the equation; and wherein locations of specified memory cells are on a diagonal line on an array of memory cells in the semiconductor memory device under test where overall numbers of memory cells in a row (X) and column (Y) are different from each other.

* * * * *